United States Patent
Crosley

(10) Patent No.: US 9,258,892 B2
(45) Date of Patent: Feb. 9, 2016

(54) CIRCUIT MATERIALS, CIRCUITS LAMINATES, AND METHOD OF MANUFACTURE THEREOF

(71) Applicant: Rogers Corporation, Rogers, CT (US)

(72) Inventor: Jessica Crosley, Chandler, AZ (US)

(73) Assignee: ROGERS CORPORATION, Rogers, CT (US)

( * ) Notice: Subject to any disclaimer, the term of this patent is extended or adjusted under 35 U.S.C. 154(b) by 7 days.

(21) Appl. No.: 14/334,876

(22) Filed: Jul. 18, 2014

(65) Prior Publication Data

US 2015/0030824 A1 Jan. 29, 2015

Related U.S. Application Data

(60) Provisional application No. 61/857,357, filed on Jul. 23, 2013.

(51) Int. Cl.
| | |
|---|---|
| *B32B 3/02* | (2006.01) |
| *H05K 1/03* | (2006.01) |
| *C03C 11/00* | (2006.01) |
| *H05K 3/46* | (2006.01) |

(52) U.S. Cl.
CPC .............. *H05K 1/0373* (2013.01); *C03C 11/00* (2013.01); *H05K 3/4626* (2013.01); *H05K 3/4652* (2013.01); *H05K 2201/0209* (2013.01); *H05K 2201/0254* (2013.01); *Y10T 428/249971* (2015.04); *Y10T 428/249974* (2015.04)

(58) Field of Classification Search
CPC ........... Y10T 428/249971; Y10T 428/249974; H05K 1/0373; H05K 3/4652; H05K 2201/0209; C03C 11/00
See application file for complete search history.

(56) References Cited

U.S. PATENT DOCUMENTS

| | | | |
|---|---|---|---|
| 3,699,050 A | 10/1972 | Henderson | |
| 4,134,848 A | 1/1979 | Adicoff et al. | |
| 4,610,495 A | 9/1986 | Landi | |
| 4,661,301 A | 4/1987 | Okada | |
| 4,904,293 A | 2/1990 | Garnier et al. | |
| 5,126,192 A | 6/1992 | Chellis et al. | |
| 5,194,459 A * | 3/1993 | Sato | C08J 9/32 428/313.3 |
| 5,354,611 A * | 10/1994 | Arthur | C08K 7/28 264/211 |
| 5,358,775 A | 10/1994 | Horn | |
| 5,534,348 A * | 7/1996 | Miller | B01J 13/043 428/402 |

(Continued)

FOREIGN PATENT DOCUMENTS

| | | |
|---|---|---|
| EP | 0512401 A2 | 11/1992 |
| GB | 2243604 A | 3/1992 |
| WO | 9116273 A1 | 10/1991 |

OTHER PUBLICATIONS

Patent Cooperation Treaty; International Searching Authority; Search Report; PCT/US2014/047178; Date of mailing: Oct. 29, 2014; 5 pages.

(Continued)

*Primary Examiner* — Elizabeth Mulvaney
(74) *Attorney, Agent, or Firm* — Cantor Colburn LLP

(57) ABSTRACT

A circuit subassembly is disclosed comprising a conductive metal layer and a dielectric substrate layer having a dielectric constant of less than about 3.5 and a dissipation factor of less than about 0.006 at 10 GHz, wherein the composition of the dielectric substrate layer comprises about 5 to about 70 volume percent of borosilicate microspheres that have been treated with an alkaline solution.

34 Claims, 1 Drawing Sheet

(56) References Cited

U.S. PATENT DOCUMENTS

| | | |
|---|---|---|
| 5,591,684 A | 1/1997 | Kawachi et al. |
| 5,593,526 A * | 1/1997 | Yokouchi ................ H01L 23/15 |
| | | 156/89.15 |
| 8,187,696 B2 | 5/2012 | Paul et al. |
| 2002/0004111 A1 | 1/2002 | Matsubara et al. |
| 2006/0000823 A1 * | 1/2006 | Truckai ................. H05B 3/146 |
| | | 219/505 |
| 2010/0015404 A1 * | 1/2010 | Paul ..................... H05K 1/0373 |
| | | 428/172 |

OTHER PUBLICATIONS

Patent Cooperation Treaty; International Searching Authority; Written Opinion; PCT/US2014/047178; Date of mailing: Oct. 29, 2014; 6 pages.

* cited by examiner

CIRCUIT MATERIALS, CIRCUITS LAMINATES, AND METHOD OF MANUFACTURE THEREOF

BACKGROUND

This invention generally relates to circuit materials, methods for the manufacture of the circuit materials, and articles formed therefrom, including circuits and circuit laminates.

As used herein, a circuit material is an article used in the manufacture of circuits and multi-layer circuits, and includes circuit subassemblies, bond plies, resin coated conductive layers, unclad dielectric layers, and cover films. A circuit laminate is a type of circuit subassembly that has a conductive layer, e.g., copper, fixedly attached to a dielectric layer. Double clad circuit laminates have two conductive layers, one on each side of the dielectric layer. Patterning a conductive layer of a laminate, for example by etching, provides a circuit. Multilayer circuits comprise a plurality of conductive layers, at least one of which contains a conductive wiring pattern. Typically, multilayer circuits are formed by laminating one or more circuits together using bond plies, by building up additional layers with resin coated conductive layers that are subsequently etched, or by building up additional layers by adding unclad dielectric layers followed by additive metallization. After forming the multilayer circuit, known hole-forming and plating technologies can be used to produce useful electrical pathways between conductive layers.

A dielectric layer can comprise a polymeric dielectric composite material in which the dielectric and physical properties are controlled by the use of mineral or ceramic particulate fillers. Particularly where a low dielectric constant is desired, hollow glass or ceramic microspheres can be used. For example, U.S. Pat. No. 4,134,848 (Adicoff et al.) describes a composite for a strip line board material that contains hollow, air-filled glass microspheres in a hydrocarbon matrix. U.S. Pat. No. 4,661,301 (Okada and Fujino) discloses a hollow-glass microsphere-filled polymer composite made by directly extruding a molten composition into the opening of a vertical double belt press. U.S. Pat. No. 5,126,192 (Chellis et al.) discloses a filled prepreg material having a dielectric constant below 3.2 and made using hollow microspheres from various manufacturers. U.S. Pat. No. 4,610,495 (Landi) discloses the use of a layer of elastomer filled with hollow microspheres for controlling impedance in a solderless connector for a microelectronic device. U.S. Pat. No. 4,994,316 (Browne and Jarvis) discloses a bonding layer for circuit boards containing hollow glass microspheres.

Following these earlier patents, U.S. Pat. No. 8,187,696 (Paul et al.) disclosed, as a less costly alternative to the use of synthetic microspheres in circuit products, the use of naturally occurring hollow microspheres known as cenospheres, so long as the cenospheres meet certain compositional requirements. Selected cenospheres were found to advantageously provide a low $D_k$ and other desired electrical properties, while maintaining the filler volume necessary for preservation of mechanical properties. Following commercial production, however, the concern developed that the available quantities might not be guaranteed indefinitely. This supply constraint coupled with the variable nature of the naturally sourced product, even on a lot to lot basis, has prompted investigation into synthetic alternatives for the use of cenospheres. A specific desire is to obtain filler having electrical properties necessary for high frequency applications that require a low dissipation factor in circuit subassemblies.

Hollow glass microspheres have been manufactured for a wide variety of uses in composite materials. For example, hollow microspheres have been used as a component of syntactic foams for the hulls of submersibles. Such microspheres have also been used for storage and/or slow release of pharmaceuticals or hydrogen gas. The microspheres typically have a diameter ranging from 10 to 300 micrometers and are sometimes termed microballoons or glass bubbles.

Hollow glass microspheres can be made by a variety of processes, including ultrasonic spray pyrolysis. The desired properties of the formed microspheres can be improved, for certain uses, by surface treatment that can involve removing at least some of the sodium. For example, among other reasons, producing microspheres having a clean surface can enhance the wettability of the microspheres by various polymers. Also, sodium depletion of the microspheres may be desirable for applications in which glass microspheres are mixed with a chemically sensitive resin. Finally, surface treatment of microspheres can improve bonding for coupling reactions if desired.

U.S. Pat. No. 4,904,293 (Garnier) discloses treatment of glass microspheres, after their production and recovery, to increase thermal resistance, by contacting the microspheres with a dealkylization agent that increases the silica content, thereby reducing the sodium content. After production, the alkaline oxide content of the microspheres is ordinarily less than 10%. In this case, the dealkylization has the aim of bringing the alkaline oxide content below 4% or less.

Leforge, J. W. et al., in "The Development of Silica Hollow Microspheres for Use as a High Temperature Dielectric," Technical Report 60-899 (July 1961), prepared by Emerson & Cuming under USAF Contract No. AF33 (616)-7263, available from Armed Services Technical Information Agency, Arlington, Va., discloses the production of bulk microsphere materials having a low dielectric constant (less than 2.0) and a low dissipation factor (less than 0.008) that are useful at temperatures greater than 200° C. In particular, sodium borosilicate glass microspheres ("microbubbles") were acid leached to remove sodium in order to increase high temperature stability (1090° C.). Specifically, Eccosphere® microspheres of various densities were acid leached for various periods of time in various concentration of $H_2SO_4$ or HCl. Following acid leaching of the microspheres, the authors found that a slightly lower dielectric constant and equivalent loss tangent values were obtained, i.e., the authors found that the loss tangents did not decrease in spite of removal of all extractable sodium.

In view of the above, there remains a need in the art for low dielectric constant, low loss circuit materials having improved (lower) dissipation factor.

SUMMARY OF INVENTION

The above-described drawbacks and disadvantages are alleviated by a circuit subassembly comprising a conductive layer disposed on a dielectric substrate layer, wherein the dielectric substrate layer comprises, based on the volume of the dielectric layer, about 30 to about 90 volume percent of a polymer matrix material, and about 5 to about 70 volume percent of hollow borosilicate microspheres that are the product of a process in which the borosilicate microspheres have been treated with an alkaline solution, thereby modifying the surface of the microspheres, wherein the dielectric substrate layer has a dielectric constant of less than about 3.5 and a dissipation factor of less than about 0.006 at 10 GHz. The dissipation factor can be measured by the IPC-TM-650 2.5.5.5.1 X-band strip line method.

Another aspect of the invention is directed to a method of making a circuit subassembly, the method comprising combining a polymer matrix material and a filler component to form a dielectric composite material, wherein the filler component comprises a plurality of hollow borosilicate microspheres; wherein the borosilicate microspheres have been treated with an alkaline solution to modify the surface thereof; forming a layer of the dielectric composite material, thereby obtaining a dielectric substrate layer; disposing a conductive layer on the dielectric substrate layer; and laminating the dielectric composite layer and the conductive layer to form a dielectric substrate layer having a dielectric constant of less than about 3.5 and a dissipation factor of less than about 0.006 at 10 GHz.

Advantageously, the circuit subassemblies can exhibit improved combination of $D_k$, $D_f$ and PIM performance, as discussed below. The filler, because it can be synthetically made, can be obtained in theoretically inexhaustible supply.

Also disclosed are a circuit and multilayer circuit comprising the above-described dielectric subassembly.

The invention is further illustrated by the following drawings, detailed description, and examples.

BRIEF DESCRIPTION OF DRAWINGS

Referring now to the exemplary drawings wherein like elements are numbered alike in the figure.

DETAILED DESCRIPTION

Figure 1:
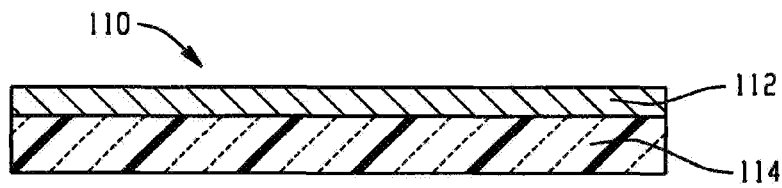
FIG. 1 is a schematic of a single clad laminate.

It has been unexpectedly discovered by the inventors hereof that use of certain synthetic borosilicate microspheres as a particulate filler in dielectric composite materials allows for the manufacture of circuit subassemblies having an improved dissipation factor. Such circuit subassemblies are especially advantageous for high frequency applications. Specifically, the borosilicate microspheres can exhibit a loss tangent of less than 0.006 at 10 GHz. Circuits and multilayer circuits based on the presently disclosed dielectric composite material can exhibit properties superior to other circuit materials in the prior art that comprise synthetic glass hollow microspheres.

Borosilicate microspheres are hollow spheres having a mean diameter of less than 300 micrometers, for example 15-200 microns, more specifically 20 to 100 microns. The density of the hollow microspheres can range from 0.1 or more, specifically 0.2 to 0.6, more specifically 0.3 g/cc to 0.5 g/cc.

Hollow microspheres are available from a number of commercial sources, for example from Trelleborg Offshore (Boston), formerly Emerson and Cuming, Inc., W.R. Grace and Company (Canton, Mass.), and 3M Company (St. Paul, Minn.). Such hollow microspheres are referred to as microballoons, glass bubbles, microbubbles, or the like and are sold in various grades, for example, which can vary according to density, size, coatings, and/or surface treatments.

For example, microspheres can have an exterior surface chemically modified by treatment with a coupling agent that can react with hydroxyl groups present on the surface of the glass. In one embodiment, the coupling agent is a silane or epoxy, specifically an organosilane having, at one end, a group that can react with hydroxyl groups present on the exterior surface of the glass microspheres and, on the other end, an organic group that will aid in dispersibility of the microspheres in a polymer matrix that has low polarity. A difunctional silane coupling can have a combination of groups selected from vinyl, hydroxy, and amino groups, for example, 3-amino-propyltriethoxy silane. Silane coatings can also minimize water absorption.

The borosilicate microspheres can be made of alkali borosilicate glass. An exemplary oxide composition of alkali borosilicate can comprise 76.6 wt. % $SiO_2$, 21.3 wt. % $Na_2O$, 1.9 wt. % $B_2O_3$, and 0.2 wt. % other components. An exemplary soda-lime borosilicate can comprise 80.7 wt. % $SiO_2$, 6.9 wt. % $Na_2O$, 10.3 wt. % CaO, 2.1 wt. % $B_2O_3$, and 1.9% of impurities. Thus, the composition (although mostly $SiO_2$ and comprising at least 1 percent $B_2O_3$) can vary to some extent, depending on the starting materials. An exemplary XPS analysis of borosilicate microspheres, after removal of sodium by acid washing is 98.7 wt. % $SiO_2$, 0.1 wt. % $Na_2O$, and 1.2 wt. % $B_2O_3$, whereas an exemplary XPS analysis of the same or similar microspheres, after removal of sodium by alkaline washing is 87.5 wt. % $SiO_2$, 3.4 wt. % $Na_2O$, 3.6 wt. % MgO, and 3.3 wt. % $B_2O_3$, 1.2 wt. % BaO, 0.7 wt. % CaO, and 0.4 wt. % $Fe_2O_3$. An iron content, less than 0.50 wt. %, as measured via surface XPS analysis, therefore, can be obtained without undue difficulty.

The production of hollow microspheres is a well-established technology. There are several methods available to produce hollow microspheres. A common approach involves the decomposition of a substance at very high temperature to form a gaseous composition within liquid droplets. The rapid expansion of the gaseous composition at high temperature causes the formation of a bubble. The hollow droplets are then rapidly cooled from the liquid state to form hollow microspheres.

The production of hollow borosilicate microspheres can be made generally in accordance with conventional processes in the prior art such as, for example, U.S. Pat. No. 3,699,050, which discloses a dried-gel process in which a solution of glass-forming oxides is dried to a hard residue, or gel, and then ground to a suitable particle size. The ground material is sieved into narrow size ranges and then mechanically dropped through a high-temperature furnace or spray tower. It appears that the chemically bound water in the gel inflates the particle as the surface melts, forming a hollow-glass microsphere. A blowing agent can also be used. U.S. Pat. No. 4,904,293 to Garnier discloses the production of microspheres having a high silica content, in which a starting glass is reduced to fine particles by grinding, optionally mixed with a blowing agent, and then passed through the flame of a burner at a temperature of 1500° C. or above to form molten hollow microspheres that are then cooled to form solid hollow microspheres.

An alternative method producing hollow microspheres involves mixing trace amounts of a sulfur-containing compound such as sodium sulfate with a borosilicate glass which mixture is then dropped into a hot flame that melts the powdered glass and sodium sulfate. The melting of the sodium sulfate results in a decomposition reaction that releases minute amounts of sulfur gas that form bubbles within the molten glass droplets. The presence of such sulfur-containing compounds or other such polar compounds, however, can have undesirable adverse effects during later processing of circuit materials. Hence, the interior of the microspheres, in a specific embodiment, comprises an inert, non-polar, sulfur-free gas composition, for example, a composition comprising non-polar compounds such as nitrogen, carbon dioxide, oxygen and less than 1 wt. % of compounds such as sulfur dioxide, specifically the absence of sulfur dioxide. In one embodiment, at least 98 wt. %, specifically at least 99 wt. % of the gaseous composition in the microspheres is inert, for example, selected from the group consisting of nitrogen, oxygen, argon, carbon dioxide, and combinations thereof.

The microspheres, after being produced at high temperature and recovered are contacted with a dealkylization agent to reduce the sodium content. The original sodium oxide content of the produced and recovered microspheres can be more than about 6 wt. %, specifically more than about 7 wt. %. The dealkylization operation has the aim to bring the sodium oxide ($Na_2O$) content to an amount less than about 5.0 wt. %, specifically below about 4% wt. %, as determined by XPS surface analysis. Thus, the wt. % of sodium oxide in the microsphere can be 0 to 5.0 wt. %, specifically 0.1 to 4.5 wt. %. In one embodiment, the wt. % of sodium oxide is 1.0 to 5.0 wt. %, specifically 2.0 to 4.5 wt. %, more specifically 2.5 to 4.0 wt. %. In one embodiment, the sodium content is reduced to an amount of less than about 5 weight percent, based on the weight of the microspheres, after a reduction in the total amount of sodium by at least 25 wt. %, specifically by at least 50 wt. %.

The dealkylization treatment can be performed chemically. The dealkylization treatment can occur at an elevated temperature or at room temperature, in a batch or continuous process. In one embodiment, the treatment can extend for the amount of time sufficient to obtain the desired depletion in sodium content. Accordingly, the hollow microspheres, after formation at high temperature and after having been subjected to dealkylization to remove alkali (sodium) ions, can have a surface layer that is depleted in sodium ions, which can extend into the bulk of the borosilicate glass material.

As will be described in greater detail in the examples below, it was unexpectedly found that improved circuit subassemblies, especially for high frequency applications, can be obtained by using, as a filler for a dielectric composite material, hollow microspheres that have been treated with an alkaline dealkylization agent, thereby obtaining a circuit subassembly having a loss tangent of less than 0.006 at 10 GHz. More specifically, the use of alkaline-washed borosilicate microspheres having a sodium oxide content of less than 4 weight percent, based on XPS surface analysis of the borosilicate microspheres, was found to unexpectedly result in a dielectric material providing desired electrical properties, particularly for high frequency circuit applications, including a dissipation factor ($D_f$) that is less than 0.006, specifically less than 0.004, more specifically equal to or less than 0.0035 at 10 GHz.

Dissipation factor ($D_f$) is a measure of loss-rate of energy of an electrical oscillation in a dissipative system. Electrical potential energy is dissipated to some extent in all dielectric materials, usually in the form of heat. $D_f$ will vary depending on the dielectric material and the frequency of the electrical signals. Dissipation factor ($D_f$) and loss tangent are the same for present purposes. Another property of relevance to circuit subassemblies is Passive Intermodulation (PIM), which is the generation of unwanted frequencies due to non-linearities in the current-voltage relationship of passive elements. PIM is a growing issue for cellular networks. PIM can create interference that reduces the sensitivity of a cellular system. The presence of ferromagnetic materials such as iron can contribute to generation of significant amounts of PIM.

Dissipation factor and PIM are especially relevant to PCB (printed circuit board) antennas. Antennas are a critical component in any transmission system or wireless communication infrastructure, for example, cellular base station antennas. As such, careful consideration is given to the properties of high frequency laminates used in PCB antennas. For such applications, a $D_k$ of less than 3.5, a $D_f$ of less than 0.004, and a PIM of less than −153 dBc are desirable. In one embodiment, the circuit subassembly exhibits a dissipation factor of 0.0030 to 0.0035 at 10 GHz, a PIM of less than −153 dBc, and a dielectric constant between 2.5 and 3.5.

The size of the microspheres and their size distribution can vary, depending on the desired characteristics of the dielectric composite material. In an exemplary embodiment, the borosilicate microspheres of the particulate filler exhibit a mean particle diameter of about 20 to about 100 micrometers, specifically about 25 to about 75 micrometers, more specifically about 20 to about 70 micrometers, for example 30 to 65 or 40 to 55, most specifically about 35 to about 60 micrometers. The size distribution can be bimodal, trimodal, or the like.

The borosilicate microspheres are present in the dielectric composite material of the circuit subassembly in an amount effective to lower the dielectric constant of the composition to the desired level without a significant negative effect on dissipation factor. Furthermore, the dielectric composite material can be used in high frequency circuit applications.

In some cases, it is desirable to fine-tune the dielectric constant of a circuit substrate to a predetermined value, while maintaining a volume loading of filler that achieves a low coefficient of thermal expansion. In such cases, the desired effect can be obtained by loading levels of the borosilicate microspheres as low as about 10 volume percent. In one embodiment, the borosilicate microspheres are present in the dielectric composite material in an amount of about 1 to about 70 volume percent (vol. %), based on the total volume of the composition, specifically about 5 to about 50 vol. %, depending on the desired dielectric constant. For example, in a 2.55-$D_k$ dielectric composite material, the microspheres can be present in an amount of 27.0 to 29.5 volume percent, whereas in a 3.0 Dk dielectric composite material, the microspheres can be present in an amount of 14.5 to 16.5 volume percent.

The dielectric composite material can optionally include one or more additional particulate fillers other than the borosilicate microspheres. Use of additional types of fillers allows the dielectric constant, dissipation factor, coefficient of thermal expansion, and other properties of the dielectric composite material to be fine-tuned. Examples of secondary particulate fillers include, without limitation, titanium dioxide (rutile and anatase), barium titanate, strontium titanate, silica (including fused amorphous silica), corundum, wollastonite, $Ba_2Ti_9O_{20}$, solid glass spheres, synthetic glass or ceramic hollow spheres, quartz, boron nitride, aluminum nitride, silicon carbide, beryllia, alumina, alumina trihydrate, magnesia, mica, talcs, nanoclays, and magnesium hydroxide. A single secondary filler, or a combination of secondary fillers, can be used to provide a desired balance of properties. Optionally, the fillers can be surface treated with a silicon-containing coating, for example, an organofunctional alkoxy silane coupling agent. Alternatively, a zirconate or titanate coupling agent can be used. Such coupling agents can improve the dispersion of the filler in the polymeric matrix and reduce water absorption of the finished composite circuit substrate.

The dielectric composite can also optionally contain constituents useful for making the material resistant to flame. Such constituents are typically present in overall composite volumes ranging from 0 to 30 volume percent. These flame retarding agents can be halogenated or not. The choice of flame retardant can influence the loading required to achieve the desired level of flame resistance.

The total filler component used to manufacture the dielectric composite material can accordingly comprise from 5 to 70 vol. % of the borosilicate microspheres and from 1 to 90 vol. % of one or more secondary fillers, specifically from 25 to 75 vol. % of secondary filler, based on the total composition of 100 percent. In one embodiment, the filler component comprises 5 to 50 vol. % of the borosilicate microspheres and 70 to 30 vol. % of fused amorphous silica as secondary filler.

The borosilicate microspheres are dispersed in a dielectric polymer matrix material to form the dielectric composite material for a circuit subassembly. Exemplary dielectric polymer matrix materials include low polarity, low dielectric constant and low loss polymer resins, including those based on thermosetting and thermoplastic resins such as 1,2-polybutadiene (PBD), polyisoprene, polybutadiene-polyisoprene copolymers, polyetherimide (PEI), fluoropolymers such as polytetrafluoroethylene (PTFE), polyimide, polyetheretherketone (PEEK), polyamidimide, polyethylene terephthalate (PET), polyethylene naphthalate, polycyclohexylene terephthalate, polybutadiene-polyisoprene copolymers, polyphenylene ether resins, and those based on allylated polyphenylene ether resins. These materials exhibit the desirable features of low dielectric constant that can be further improved (i.e., reduced) by addition of the borosilicate microspheres. Combinations of low polarity resins with higher polarity resins can also be used, non-limiting examples including epoxy and poly(phenylene ether), epoxy and poly(ether imide), cyanate ester and poly(phenylene ether), and 1,2-polybutadiene and polyethylene.

Suitable fluoropolymer matrix materials for the dielectric layer include fluorinated homopolymers, e.g., polytetrafluoroethylene (PTFE) and polychlorotrifluoroethylene (PCTFE), and fluorinated copolymers, e.g. copolymers of tetrafluoroethylene with a monomer selected from the group consisting of hexafluoropropylene and perfluoroalkylvinylethers, copolymers of tetrafluoroethylene with a monomer selected from the group consisting of vinylidene fluoride, vinyl fluoride and ethylene, and copolymers of chlorotrifluoroethylene with a monomer selected from the group of hexafluoropropylene, perfluoroalkylvinylethers, vinylidene fluoride, vinyl fluoride and ethylene. Blends of these fluoropolymers and terpolymers formed from the above listed monomers can also be used as the polymer matrix material.

Other specific polymer matrix materials include thermosetting polybutadiene and/or polyisoprene resin. As used herein, the term "thermosetting polybutadiene and/or polyisoprene resin" includes homopolymers and copolymers comprising units derived from butadiene, isoprene, or mixtures thereof. Units derived from other copolymerizable monomers can also be present in the resin, for example, optionally in the form of grafts. Exemplary copolymerizable monomers include, but are not limited to, vinylaromatic monomers, for example substituted and unsubstituted monovinylaromatic monomers such as styrene, 3-methylstyrene, 3,5-diethylstyrene, 4-n-propylstyrene, alpha-methylstyrene, alpha-methyl vinyltoluene, para-hydroxystyrene, para-methoxystyrene, alpha-chlorostyrene, alpha-bromostyrene, dichlorostyrene, dibromostyrene, tetra-chlorostyrene, and the like; and substituted and unsubstituted divinylaromatic monomers such as divinylbenzene, divinyltoluene, and the like. Combinations comprising at least one of the foregoing copolymerizable monomers can also be used. Exemplary thermosetting polybutadiene and/or polyisoprene resins include, but are not limited to, butadiene homopolymers, isoprene homopolymers, butadiene-vinylaromatic copolymers such as butadiene-styrene, isoprene-vinylaromatic copolymers such as isoprene-styrene copolymers, and the like.

The thermosetting polybutadiene and/or polyisoprene resins can also be modified. For example, the resins can be hydroxyl-terminated, methacrylate-terminated, carboxylate-terminated resins or the like. Post-reacted resins can be used, such as epoxy-, maleic anhydride-, or urethane-modified butadiene or isoprene resins. The resins can also be crosslinked, for example by divinylaromatic compounds such as divinyl benzene, e.g., a polybutadiene-styrene crosslinked with divinyl benzene. Exemplary resins are broadly classified as "polybutadienes" by their manufacturers, for example, Nippon Soda Co., Tokyo, Japan, and Cray Valley Hydrocarbon Specialty Chemicals, Exton, Pa. Mixtures of resins can also be used, for example, a mixture of a polybutadiene homopolymer and a poly(butadiene-isoprene) copolymer. Combinations comprising a syndiotactic polybutadiene can also be useful.

The thermosetting polybutadiene and/or polyisoprene resin can be liquid or solid at room temperature. Suitable liquid resins can have a number average molecular weight greater than about 5,000 but generally have a number average molecular weight of less than about 5,000 (most preferably about 1,000 to about 3,000). Thermosetting polybutadiene and/or polyisoprene resins include resins having at least 90 wt. % 1,2 addition, which can exhibit greater crosslink density upon cure due to the large number of pendent vinyl groups available for crosslinking.

The polybutadiene and/or polyisoprene resin can be present in the polymer matrix composition in an amount of up to 100 wt. %, specifically up to about 75 wt. % with respect to the total resin system, more specifically about 10 to about 70 wt. %, even more specifically about 20 to about 60 or 70 wt. %, based on the total polymer matrix composition.

Other polymers that can co-cure with the thermosetting polybutadiene and/or polyisoprene resins can be added for specific property or processing modifications. For example, in order to improve the stability of the dielectric strength and mechanical properties of the electrical substrate material over time, a lower molecular weight ethylene propylene elastomer can be used in the resin systems. An ethylene propylene elastomer as used herein is a copolymer, terpolymer, or other polymer comprising primarily ethylene and propylene. Ethylene propylene elastomers can be further classified as EPM copolymers (i.e., copolymers of ethylene and propylene monomers) or EPDM terpolymers (i.e., terpolymers of ethylene, propylene, and diene monomers). Ethylene propylene diene terpolymer rubbers, in particular, have saturated main chains, with unsaturation available off the main chain for facile cross-linking. Liquid ethylene propylene diene terpolymer rubbers, in which the diene is dicyclopentadiene, can be used.

The molecular weights of the ethylene propylene rubbers can be less than 10,000 viscosity average molecular weight. Suitable ethylene propylene rubbers include an ethylene propylene rubber having a viscosity average molecular weight (MV) of about 7,200, which is available from Lion Copolymer, Baton Rouge, La., under the trade name Trilene® CP80; a liquid ethylene propylene dicyclopentadiene terpolymer rubbers having a molecular weight of about 7,000, which is available from Lion Copolymer under the trade name of Trilene® 65; and a liquid ethylene propylene ethylidene norbornene terpolymer, having a molecular weight of about 7,500, which is available from Lion Copolymer under the name Trilene® 67.

The ethylene propylene rubber can be present in an amount effective to maintain the stability of the properties of the substrate material over time, in particular the dielectric strength and mechanical properties. Typically, such amounts are up to about 20 wt. % with respect to the total weight of the polymer matrix composition, more specifically about 4 to about 20 wt. %, even more specifically about 6 to about 12 wt. %.

Another type of co-curable polymer is an unsaturated polybutadiene- or polyisoprene-containing elastomer. This component can be a random or block copolymer of primarily 1,3-addition butadiene or isoprene with an ethylenically unsaturated monomer, for example a vinylaromatic compound such as styrene or alpha-methyl styrene, an acrylate or methacrylate such a methyl methacrylate, or acrylonitrile. The elastomer can be a solid, thermoplastic elastomer comprising a linear or graft-type block copolymer having a polybutadiene or polyisoprene block and a thermoplastic block that can be derived from a monovinylaromatic monomer such as styrene or alpha-methyl styrene. Block copolymers of this type include styrene-butadiene-styrene triblock copolymers, for example, those available from Dexco Polymers, Houston, Tex. under the trade name Vector 8508M®, from Enichem Elastomers America, Houston, Tex. under the trade name Sol-T-6302®, and those from Dynasol Elastomers under the trade name Calprene® 401; and styrene-butadiene diblock copolymers and mixed triblock and diblock copolymers containing styrene and butadiene, for example, those available from Kraton Polymers (Houston, Tex.) under the trade name KRATON D1118. KRATON D1118 is a mixed diblock/triblock styrene and butadiene containing copolymer that contains 33% by weight styrene.

The optional polybutadiene- or polyisoprene-containing elastomer can further comprise a second block copolymer similar to that described above, except that the polybutadiene or polyisoprene block is hydrogenated, thereby forming a polyethylene block (in the case of polybutadiene) or an ethylene-propylene copolymer block (in the case of polyisoprene). When used in conjunction with the above-described copolymer, materials with greater toughness can be produced. An exemplary second block copolymer of this type is KRATON GX1855 (commercially available from Kraton Polymers, which is believed to be a mixture of a styrene-high 1,2-butadiene-styrene block copolymer and a styrene-(ethylene-propylene)-styrene block copolymer.

Typically, the unsaturated polybutadiene- or polyisoprene-containing elastomer component is present in the resin system in an amount of about 2 to about 60 wt. % with respect to the total polymer matrix composition, more specifically about 5 to about 50 wt. %, or even more specifically about 10 to about 40 or 50 wt. %.

Still other co-curable polymers that can be added for specific property or processing modifications include, but are not limited to, homopolymers or copolymers of ethylene such as polyethylene and ethylene oxide copolymers; natural rubber; norbornene polymers such as polydicyclopentadiene; hydrogenated styrene-isoprene-styrene copolymers and butadiene-acrylonitrile copolymers; unsaturated polyesters; and the like. Levels of these copolymers are generally less than 50 wt. % of the total polymer in the matrix composition.

Free radical-curable monomers can also be added for specific property or processing modifications, for example to increase the crosslink density of the resin system after cure. Exemplary monomers that can be suitable crosslinking agents include, for example, di, tri-, or higher ethylenically unsaturated monomers such as divinyl benzene, triallyl cyanurate, diallyl phthalate, and multifunctional acrylate monomers (e.g., Sartomer® resins available from Sartomer USA, Newtown Square, Pa.), or combinations thereof, all of which are commercially available. The crosslinking agent, when used, can be present in the resin system in an amount of up to about 20 wt. %, specifically 1 to 15 wt. %, based on the total polymer matrix composition.

A curing agent can be added to the resin system to accelerate the curing reaction of polyenes having olefinic reactive sites. Specifically useful curing agents are organic peroxides such as, for example, dicumyl peroxide, t-butyl perbenzoate, 2,5-dimethyl-2,5-di(t-butyl peroxy)hexane, α,α-di-bis(t-butyl peroxy)diisopropylbenzene, and 2,5-dimethyl-2,5-di(t-butyl peroxy) hexyne-3, all of which are commercially available. Carbon-Carbon initiators can be used in the resin system, for example, 2,3-dimethyl-2,3 diphenylbutane. Curing agents or initiators can be used alone or in combination. Typical amounts of curing agent are from about 1.5 to about 10 wt. % of the total polymer matrix composition.

In one embodiment, the polybutadiene or polyisoprene polymer is carboxy-functionalized. Functionalization can be accomplished using a polyfunctional compound having in the molecule both (i) a carbon-carbon double bond or a carbon-carbon triple bond, and (ii) one or more of a carboxy group, including a carboxylic acid, anhydride, amide, ester, or acid halide. A specific carboxy group is a carboxylic acid or ester. Examples of polyfunctional compounds that can provide a carboxylic acid functional group include maleic acid, maleic anhydride, fumaric acid, and citric acid. In particular, polybutadienes adducted with maleic anhydride can be used in the thermosetting composition. Suitable maleinized polybutadiene polymers are commercially available, for example from Cray Valley under the trade names RICON 130MA8, RICON 130MA13, RICON 130MA20, RICON 131MA5, RICON 131MA10, RICON 131MA17, RICON 131MA20, and RICON 156MA17. Suitable maleinized polybutadiene-styrene copolymers are commercially available, for example, from Sartomer under the trade names RICON 184MA6. RICON 184MA6 is a butadiene-styrene copolymer adducted with maleic anhydride having styrene content from 17 to 27 wt. % and number average molecular weight ($M_n$) of about 9,900 g/mole.

The relative amounts of the various polymers, for example, the polybutadiene or polyisoprene polymer and other polymers, can depend on the particular conductive metal layer used, the desired properties of the circuit materials and circuit laminates, and like considerations. For example, it has been found that use of a poly(arylene ether) can provide increased bond strength to the conductive metal layer, particularly copper. Use of a polybutadiene or polyisoprene polymer can increase high temperature resistance of the laminates, particularly when these polymers are carboxy-functionalized. Use of an elastomeric block copolymer can function to compatibilize the components of the polymer matrix material. Determination of the appropriate quantities of each component can be done without undue experimentation, depending on the desired properties for a particular application.

In addition to the polymeric matrix material, the dielectric composite material can optionally further include an unwoven or woven, thermally stable web of a suitable fiber, specifically glass (E, S, and D glass) or high temperature polyester fibers. Such thermally stable fiber reinforcement provides a circuit laminate with a means of controlling shrinkage upon cure within the plane of the laminate. In addition, the use of the woven web reinforcement renders a circuit substrate with a relatively high mechanical strength.

The dielectric composite material can be produced by means known in the art. The particular choice of processing conditions can depend on the polymer matrix selected. For example, where the polymer matrix is a fluoropolymer such as PTFE, the polymer matrix material can be mixed with a first carrier liquid. The mixture can comprise a dispersion of polymeric particles in the first carrier liquid, i.e. an emulsion, of liquid droplets of the polymer or of a monomeric or oligomeric precursor of the polymer in the first carrier liquid, or a solution of the polymer in the first carrier liquid. If the polymer component is liquid, then no first carrier liquid may be necessary.

The choice of the first carrier liquid, if present, is based on the particular polymeric matrix material and the form in which the polymeric matrix material is to be introduced to the dielectric composite material. If it is desired to introduce the polymeric material as a solution, a solvent for the particular polymeric matrix material is chosen as the carrier liquid, e.g., N-methylpyrrolidone (NMP) would be a suitable carrier liquid for a solution of a polyimide. If it is desired to introduce the polymeric matrix material as a dispersion, then a suitable carrier liquid is a liquid in which the matrix material is not soluble, e.g., water would be a suitable carrier liquid for a dispersion of PTFE particles and would be a suitable carrier liquid for an emulsion of polyamic acid or an emulsion of butadiene monomer.

The filler component can optionally be dispersed in a suitable second carrier liquid, or mixed with the first carrier liquid (or liquid polymer where no first carrier is used). The second carrier liquid can be the same liquid or can be a liquid other than the first carrier liquid that is miscible with the first carrier liquid. For example, if the first carrier liquid is water, the second carrier liquid can comprise water or an alcohol. In an exemplary embodiment, the second carrier liquid is water.

The filler dispersion can include a surfactant in an amount effective to modify the surface tension of the second carrier liquid to enable the second carrier liquid to wet the borosilicate microspheres. Exemplary surfactant compounds include ionic surfactants and nonionic surfactants. Triton X-100®, commercially available from Rohm & Haas, has been found to be an exemplary surfactant for use in aqueous filler dispersions. Generally, the filler dispersion comprises from about 10 vol. % to about 70 vol. % of filler and from about 0.1 vol. % to about 10 vol. % of surfactant, with the remainder comprising the second carrier liquid.

The mixture of the polymeric matrix material and first carrier liquid and the filler dispersion in the second carrier liquid can be combined to form a casting mixture. In an exemplary embodiment, the casting mixture comprises from about 10 vol. % to about 60 vol. % of the combined polymeric matrix material and borosilicate microspheres and optional secondary filler and from about 40 vol. % to about 90 vol. % combined first and second carrier liquids. The relative amounts of the polymeric matrix material and the filler component in the casting mixture are selected to provide the desired amounts in the final composition as described below.

The viscosity of the casting mixture can be adjusted by the addition of a viscosity modifier, selected on the basis of its compatibility in a particular carrier liquid or mixture of carrier liquids, to retard separation, i.e. sedimentation or flotation, of the hollow sphere filler from the dielectric composite material and to provide a dielectric composite material having a viscosity compatible with conventional laminating equipment. Exemplary viscosity modifiers suitable for use in aqueous casting mixtures include, e.g., polyacrylic acid compounds, vegetable gums, and cellulose based compounds. Specific examples of suitable viscosity modifiers include polyacrylic acid, methyl cellulose, polyethyleneoxide, guar gum, locust bean gum, sodium carboxymethylcellulose, sodium alginate, and gum tragacanth. The viscosity of the viscosity-adjusted casting mixture can be further increased, i.e., beyond the minimum viscosity, on an application by application basis to adapt the dielectric composite material to the selected laminating technique. In an exemplary embodiment, the viscosity-adjusted casting mixture exhibits a viscosity between about 10 cp and about 100,000 cp; specifically about 100 cp and 10,000 cp. It will be appreciated by those skilled in the art that the foregoing viscosity values are room temperature values.

Alternatively, the viscosity modifier can be omitted if the viscosity of the carrier liquid is sufficient to provide a casting mixture that does not separate during the time period of interest. Specifically, in the case of extremely small particles, e.g., particles having an equivalent spherical diameter less than 0.1 micrometers, the use of a viscosity modifier may not be necessary.

A layer of the viscosity-adjusted casting mixture can be cast on a substrate by conventional methods, e.g., dip coating, reverse roll coating, knife-over-roll, knife-over-plate, and metering rod coating. Examples of carrier materials can include metallic films, polymeric films, ceramic films, and the like. Specific examples of carriers include stainless steel foil, polyimide films, polyester films, and fluoropolymer films. Alternatively, the casting mixture can be cast onto a glass web, or a glass web can be dip-coated.

The carrier liquid and processing aids, i.e., the surfactant and viscosity modifier, are removed from the cast layer, for example, by evaporation and/or by thermal decomposition in order to consolidate a dielectric layer of the polymeric matrix material and the filler comprising the hollow microspheres.

The layer of the polymeric matrix material and filler component can be further heated to modify the physical properties of the layer, e.g., to sinter a thermoplastic matrix material or to cure and/or post cure a thermosetting matrix material.

In another method, a PTFE composite dielectric material can be made by the paste extrusion and calendaring process taught in U.S. Pat. No. 5,358,775.

Useful conductive layers for the formation of the circuit laminates, multi-layer circuit laminates can include, without limitation, stainless steel, copper, gold, silver, aluminum, zinc, tin, lead, transition metals, and alloys comprising at least one of the foregoing, with copper being exemplary. There are no particular limitations regarding the thickness of the conductive layer, nor are there any limitations as to the shape, size or texture of the surface of the conductive layer. Preferably however, the conductive layer comprises a thickness of about 3 micrometers to about 200 micrometers, specifically about 9 micrometers to about 180 micrometers. When two or more conductive layers are present, the thickness of the two layers can be the same or different.

In an exemplary embodiment, the conductive layer is a copper layer. Suitable conductive layers include a thin layer of a conductive metal such as a copper foil presently used in the formation of circuits, for example, electrodeposited copper foils.

The circuit subassemblies, e.g., laminates, can be formed by means known in the art. In one embodiment, the lamination process entails placing one or more layers of the dielectric composite material between one or two sheets of coated or uncoated conductive layers (an adhesive layer can be disposed between at least one conductive layer and at least one dielectric substrate layer) to form a circuit substrate. The conductive layer can be in direct contact with the dielectric substrate layer or optional adhesive layer, specifically without an intervening layer, wherein an optional adhesive layer is less than 10 percent of the thickness of the dielectric substrate layer. The layered material can then be placed in a press, e.g., a vacuum press, under a pressure and temperature and for duration of time suitable to bond the layers and form a laminate Lamination and curing can be by a one-step process, for example using a vacuum press, or can be by a multi-step process. In an exemplary one-step process, for a PTFE polymer matrix, the layered material is placed in a press, brought up to laminating pressure (e.g., about 150 to about 400 psi) and heated to laminating temperature (e.g., about 260 to about 390° C.). The laminating temperature and pressure are maintained for the desired soak time, i.e., about 20 minutes, and thereafter cooled (while still under pressure) to below about 150° C.

In an exemplary multiple-step process suitable for thermosetting materials such as polybutadiene and/or isoprene, a conventional peroxide cure step at temperatures of about 150° C. to about 200° C. is conducted, and the partially cured stack can then be subjected to a high-energy electron beam irradiation cure (E-beam cure) or a high temperature cure step under an inert atmosphere. Use of a two-stage cure can impart an unusually high degree of cross-linking to the resulting laminate. The temperature used in the second stage is typically about 250° C. to about 300° C., or the decomposition temperature of the resin. This high temperature cure can be carried out in an oven but can also be performed in a press, namely as a continuation of the initial lamination and cure step. Particular lamination temperatures and pressures will depend upon the particular adhesive composition and the substrate composition, and are readily ascertainable by one of ordinary skill in the art without undue experimentation.

In accordance with an exemplary embodiment, FIG. 1 shows an exemplary circuit subassembly, in particular a single clad laminate 110 comprising a conductive metal layer 112 disposed on and in contact with a dielectric layer 114. The dielectric substrate layer 114 comprises a polymer matrix material having a particulate filler content of about 10 to about 70 volume percent, wherein the particulate filler comprises borosilicate microspheres. An optional glass web (not shown) can be present in dielectric substrate layer 114. It is to be understood that in all of the embodiments described herein, the various layers can fully or partially cover each other, and additional conductive layers, patterned circuit layers, and dielectric layers can also be present. Optional adhesive (bond ply) layers (not shown) can also be present, and can be uncured or partially cured. Many different multi-layer circuit configurations can be formed using the above substrates.

Figure 2:
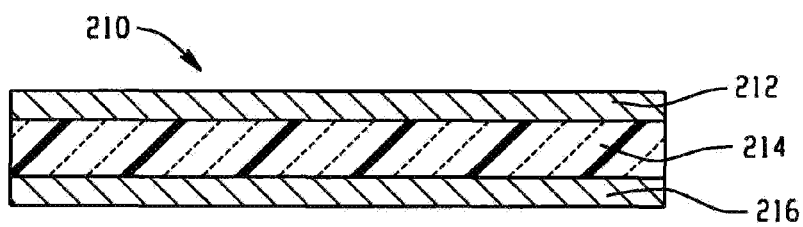
FIG. 2 is a schematic of a double clad laminate.

Another embodiment of a multilayer circuit assembly is shown at 210 in FIG. 2. Double clad circuit layer 210 comprises conductive layers 212, 216 disposed on opposite sides of a dielectric substrate layer 214 comprising borosilicate microspheres. Dielectric substrate layer 214 can comprise a woven web (not shown).

Figure 3:
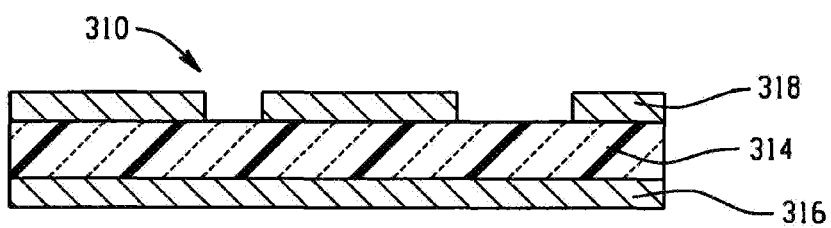
FIG. 3 is a schematic of a double clad laminate with patterned conductive layer.

A circuit subassembly 310 is shown in FIG. 3, comprising a circuit layer 318 and a conductive layer 316 disposed on opposite sides of a dielectric substrate layer 314. Dielectric substrate layer 314 can comprise a woven web (not shown).

Figure 4:
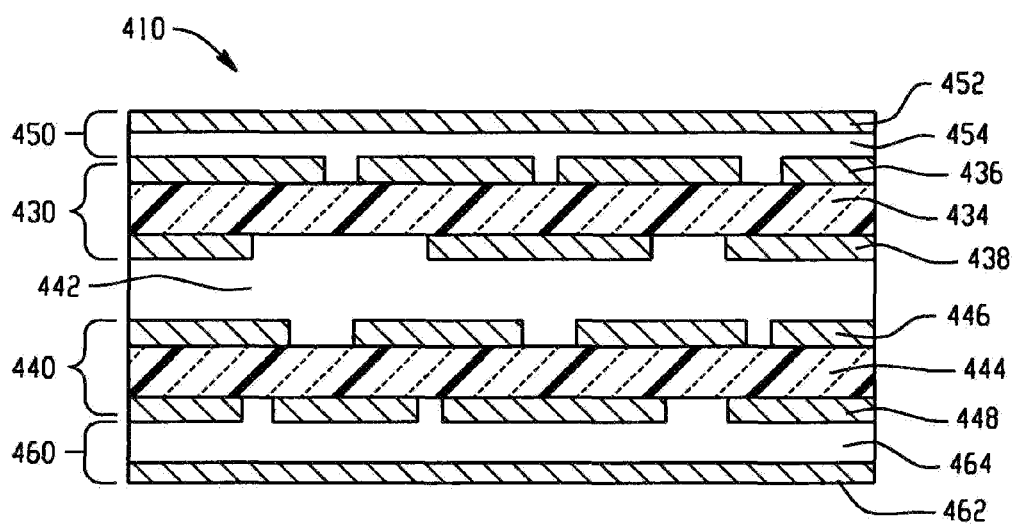
FIG. 4 is a schematic of an exemplary circuit assembly comprising two double clad circuit laminates.

FIG. 4 shows an exemplary multilayer circuit assembly 410 having a first double clad circuit 430, a second double clad circuit 440, and a bond ply 442 disposed there between. Double clad circuit 430 comprises a dielectric substrate 434 disposed between two conductive circuit layers 436, 438. Double clad circuit 440 comprises a dielectric substrate 444 disposed between two conductive circuit layers 446, 448. At least one, and preferably both, of dielectric substrates 434, 444 comprises borosilicate microspheres as a filler. Each dielectric substrate layer 434, 444 can comprise a nonwoven glass reinforcement (not shown). Two cap layers 450, 460 are also shown. Each cap layer 450, 460, includes a conductive layer 452, 462 disposed on a bond ply layer 454, 464.

Another aspect of the present invention relates to a method of making a circuit subassembly comprising combining a polymer matrix material and a filler component to form a dielectric composite material treating borosilicate microspheres with an alkaline dealkylization agent, specifically an alkaline solution to reduce the sodium content, forming a layer of the dielectric composite material, disposing a conductive layer on the dielectric composite layer, and laminating the dielectric composite layer and the conductive layer to form a circuit subassembly having a dielectric constant of less than about 3.5 and a dissipation factor of less than about 0.006.

The borosilicate microspheres can be treated with an alkaline solution. Specifically, the borosilicate microspheres can be treated with an alkaline solution to reduce the sodium oxide content, more specifically by subjecting the borosilicate microspheres to an aqueous alkaline solution (for example, having a pH greater than 8.0, more specifically greater than 10.0), the method comprising effectively leaching or washing the borosilicate microspheres for a time sufficient to reduce the level of sodium below a preselected amount. In one embodiment, the borosilicate microspheres are treated with an alkaline solution to reduce the total sodium oxide content (as determined by XPS surface analysis) by at least 25 wt. %, more specifically by at least 50 wt. %, of the original amount (in the formed and recovered microspheres), specifically to reduce the sodium content by at least 2 wt. % to a final amount less than 5.0 wt. %, for example, 1 wt. % to 4 wt. %. According to one embodiment, the borosilicate microspheres are washed with an alkaline dealkylization agent (as compared to an acidic dealkylization agent) in order to reduce the sodium oxide content by such amounts. For example, aqueous ammonium hydroxide, at a concentration effective to reduce the sodium oxide level to a desired amount, as determined by XPS surface analysis, can be used.

The above-described dielectric compositions and methods provide a circuit subassembly or circuit laminate with excellent properties. In one embodiment, the circuit laminate has a dielectric constant of less than about 3.5 measured at 10 GigaHertz. In another embodiment, the resultant circuit laminate has a dissipation factor of less than about 0.006 measured at 10 GigaHertz. In yet another embodiment, the circuit laminate has a dielectric constant of less than about 3.5 and a dissipation factor of less than about 0.006 measured at 10 GigaHertz.

The invention is further illustrated by the following non-limiting Examples.

EXAMPLES

The materials listed in Table 1 were used in the following examples. Specifically, the following filler materials were assembled for evaluation.

TABLE 1

| Microsphere Type | Specific Gravity | Mean Particle Size | $Na_2O$ Content (surface XPS) | $Fe_2O_3$ Content (surface XPS) | Further Description |
|---|---|---|---|---|---|
| Synthetic Microsphere 1 | 0.35 | 45-50 microns | <1% | 0% | Acid etched |

TABLE 1-continued

| Microsphere Type | Specific Gravity | Mean Particle Size | Na₂O Content (surface XPS) | Fe₂O₃ Content (surface XPS) | Further Description |
|---|---|---|---|---|---|
| Synthetic Microsphere 2 | 0.35 | 45-50 microns | <1% | 0% | Acid etched, narrower particle size distribution |
| Synthetic Microsphere 3 | 0.35 | 45-50 microns | <1% | 0% | Acid etched, epoxy functional silane coating |
| Synthetic Microsphere 4 | 0.20 | 53 microns | <1% | 0% | Acid etched |
| Synthetic Microsphere 5 | 0.25 | 55-60 microns | ~3.5% | 0.4% | Alkaline etched |
| Synthetic Microsphere 6 | 0.25 | 55-60 microns | ~3.5% | 0.4% | Alkaline etched, epoxy functional silane coating |
| Synthetic Microsphere 7 | 0.31 | 45-50 microns | ~3.5% | 0.4% | Alkaline etched, epoxy functional silane coating |
| Synthetic Microsphere 8 | 0.31 | 45-50 microns | ~3.5% | 0.4% | Alkaline etched |
| Naturally Sourced Microsphere 9 | 0.70 | 45-50 microns | 1.1% | 3.5% | Present in Rogers's circuit laminates RO4730 and RO4725* |

The interior of all hollow spheres in Table 1 contain only an inert gaseous mixture and are free of sulfur containing compounds. In addition to the assembled hollow spheres listed in Table 1, the following materials were used in dielectric formulations.

TABLE 2

| Component | Description | Supplier |
|---|---|---|
| Nisso-PB ® B-3000 resin | 1,2-polybutadiene | Nippon Soda Co. |
| Kraton ® D1118 resin | Styrene and butadiene block copolymer | Kraton Polymers |
| Trilene ® 65 resin | EPDM resin | Lion Copolymer |
| Teco-Sil ® CE-44i filler | Fused Silica filler | CE Minerals |
| Silane Compound | Coupling Agent | Gelest |

The synthetic microspheres are formed from sodium borosilicate glass. Once the hollow spheres are formed, at least some of the sodium is chemically removed from the ceramic matrix via an alkaline or acidic washing process. With regard to the commercially available products, the acidic removal process is relatively more efficient, with resulting in virtually no sodium, or less than 0.5 wt. %, remaining in the synthetic microspheres, as determined by surface X-Ray photoelectron spectroscopy (XPS) analysis. The alkaline treatment, tending to be comparatively less efficient for removing sodium, results in about 3.5% w/w sodium oxide remaining near the surface of the microspheres, as measured using XPS analysis. Bulk compositions are higher in sodium content. Appropriate methods for quantification of the overall sodium content include atomic absorption spectroscopy (AAS) and inductively coupled plasma spectroscopy (ICP).

The interior of the alkaline-washed synthetic microspheres is reported to contain gaseous composition comprising nitrogen (53.3% v/v), oxygen (4.80% v/v), argon (0.16% v/v), carbon dioxide (42.6% v/v), and hydrogen (0.12% v/v), within a detectable limit of 0.01 based on Mass Spectral Analysis.

Initial experimental trials were conducted primarily with the acid-washed microspheres. These filler materials were substituted on an equal basis for standard cenospheres (natural microspheres), which are used as a low-$D_k$ filler in a dielectric substrate formulated by Rogers Corporation for antenna applications. This dielectric substrate represented a challenging comparison case due to its high loading of the low-$D_k$ microspheres. The substrate exhibits a nominal dielectric constant of 2.55 when tested at 10 GHz in accordance with the IPC-TM-650 (X-band strip line method). Specifically, the incumbent cenosphere filler in a control formulation E was replaced with each of the synthetic microsphere candidate materials in the formulations A to D as detailed below:

TABLE 3

| | Comparative Examples | | | | |
|---|---|---|---|---|---|
| Component (lbs.) | A | B | C | D | E |
| Kraton ® D1118 resin | 0.149 | 0.1575 | 0.1575 | 0.2053 | 0.1558 |
| Silane coupling agent | 0.0068 | 0.0059 | 0.0059 | 0.0055 | 0.0056 |
| Trilene ® 65 cross-linker | 0.0334 | 0.0352 | 0.0352 | 0.0459 | 0.0348 |
| B3000 ® Resin | 0.1345 | 0.1419 | 0.1419 | 0.1850 | 0.1404 |
| CE-44i ® Silica | 0.5629 | 0.4809 | 0.4809 | 0.4311 | 0.3954 |
| Synthetic Microsphere 1 | 0.0991 | — | — | — | — |
| Synthetic Microsphere 2 | — | 0.1637 | — | — | — |
| Synthetic Microsphere 3 | — | — | 0.1637 | — | — |
| Synthetic Microsphere 4 | — | — | — | 0.1079 | — |
| Naturally Sourced Microsphere | — | — | — | — | 0.2532 |
| Curing agent | 0.0111 | 0.0117 | 0.0117 | 0.0153 | 0.0116 |
| Antioxidant | 0.003 | 0.0032 | 0.0032 | 0.0041 | 0.0031 |

For testing purposes, the solids in the above formulations were dispersed in xylene at a consistency of approximately 35 wt. % and coated onto 1080 style woven glass fabric to a dry solids basis weight ranging from 1.7 to 2.6 g/100 cm². Observations regarding the ease of dispersibility and difficulties in making prepregs are reported in Table 4 below. During manufacture of the prepregs, 8 to 12 plies were stacked to form approximately 0.060-inch thick laminates and were laminated to copper foil in a flat-bed press for the duration of 1.17 hours at a temperature of 475° F. and a pressure of 1100 pounds per square inch to form the cured laminates.

The laminated sheets were removed from the press and the copper foil was removed by dissolution to form test coupons. The dielectric constant and dissipation factor were tested at 10 GHz using the clamped strip line test method described in IPC-TM-650 2.5.5.5.1. $D_k$ and $D_f$ results are summarized in Table 4 below.

TABLE 4

| Formulation | Dispersibility in Mixing | Prepreg Manufacturing Issues | $D_k$ | $D_f$ |
|---|---|---|---|---|
| A | No issues | None observed. | 2.75 | 0.0054 |
| B | Would not disperse | Severe dip roller build-up after 60-100 feet | 2.43 | 0.0069 |
| C | Dispersed Ok | Satisfactory coating and narrow process window, but no build-up | 2.55 | 0.0068 |
| D | Dispersed Ok | Satisfactory coating, but buildup noted at end of run | 2.59 | 0.0059 |
| E | No Issues | None observed | 2.55 | 0.0029 |

In view of the results in Table 4, none of the formulations (A-D), containing synthetic microsphere fillers that used the acidic-wash treatment to reduce sodium were successful from the standpoint of either dissipation factor ($D_f$) or processing. A dissipation factor of less than about 0.0035 at 10 GHz is desirable for high frequency applications In comparison, synthetic microsphere fillers that received an alkaline treatment, specifically which had been subjected to alkaline washing, yielding a different microsphere surface (which is believed to produce a different interaction between filler and resin matrix) were then tested. The formulations containing the alkaline-treated synthetic microspheres are detailed in Table 5 below. The same procedures as described previously were followed.

TABLE 5

| | Comparative Examples | | | | |
|---|---|---|---|---|---|
| Component (lbs.) | F | G | H | I | E |
| Kraton ® D1118 resin | 0.1471 | 0.1471 | 0.1455 | 0.1489 | 0.1558 |
| Silane Coupling Agent | 0.0067 | 0.0067 | 0.0070 | 0.0071 | 0.0056 |
| Trilene ® 65 crosslinker | 0.0329 | 0.0329 | 0.0325 | 0.0333 | 0.0348 |
| B3000 ® Resin | 0.1325 | 0.1325 | 0.1311 | 0.1342 | 0.1404 |
| CE-44i ® silica filler | 0.5439 | 0.5439 | 0.5685 | 0.5532 | 0.3954 |
| Synthetic Microsphere 5 | 0.1232 | — | — | — | — |
| Synthetic Microsphere 6 | — | 0.1232 | — | — | — |
| Synthetic Microsphere 7 | — | — | 0.1016 | — | — |
| Synthetic Microsphere 8 | — | — | — | 0.1092 | — |
| Naturally Sourced Microsphere | — | — | — | — | 0.2532 |
| Curing agent | 0.0109 | 0.0109 | 0.0108 | 0.0111 | 0.0116 |
| Antioxidant | 0.003 | 0.003 | 0.0029 | 0.0030 | 0.0031 |

Observations regarding the ease of dispersibility and difficulties in making prepregs using the formulations in Table 5 are provided in Table 6.

TABLE 6

| Formulation | Dispersibilty in Mixing | Prepreg Manufacturing Issues | $D_k$ | $D_f$ |
|---|---|---|---|---|
| F | Difficult to disperse | Dip roller coat-out after 50-100 ft | 2.65 | 0.0027 |
| G | Dispersed well | Dip roller build-up after 300 ft | 2.55 | 0.0033 |
| H | No issues | No Issues | 2.55 | 0.0034 |
| I | No Issues | No Issues | 2.55 | 0.0026 |
| E | No Issues | No Issues | 2.55 | 0.0029 |

As evident by the results in Table 5, the shift towards the alkaline treatment had a significantly positive impact with regard to dissipation factor (or loss tangent) and, to a lesser extent, prepreg processing.

Without wishing to be bound by theory, treatment with an alkaline wash can yield improved results, specifically relative to acid wash, at least partly because of possible surface incompatibilities between the borosilicate spheres and the resin system and/or the presence of bound polar groups to the surface of the spheres. According to one theory, the hydrogen protons from the acid wash (which may replace, to some extent, leached sodium atoms in the microspheres), which hydrogen protons then reside near the surface of the leached borosilicate microspheres, may bind or attract water molecules, the presence of which can adversely affect loss tangent or dissipation factor, specifically higher dissipation factor over time.

Beginning with the alkaline-treated Synthetic Microsphere 5 (composition F), the results implied significant progress with regard to loss tangent or dissipation factor, but still presented an issue regarding prepreg processing. The alkaline-treated Synthetic Microsphere 6 (Composition G) was then evaluated in light of the favorable processing performance noted with the acid-treated Synthetic Microsphere 3 version. This improved the prepreg processing compared to composition F, but still further improvement was desired. Finally, the use of Synthetic Microspheres 7 and 8 resulted in both improved loss tangent and improved prepreg processing.

Thus, in view of the results in Table 6, the use of alkaline-treated synthetic microspheres provided a significant improvement with respect to dissipation factor. In addition, a move to a relatively smaller particle size via the alkaline-treated Synthetic Microsphere 7 (Composition H) resolved processing issues. Finally, removing the epoxy functional silane coating, as on alkaline-treated Synthetic Microsphere 8 (Composition I), which used an in-situ silanation, was found to reduce the dissipation factor even further.

Given the successful results with the alkaline-washed Synthetic Microsphere 8 filler, laminate samples were sent out for PIM testing using a Summitek Instruments 1900B® PIM Analyzer. The circuits were tested with new and reworked Type 1 connectors from FIRNIC (Changzhou Wujin Fengshi Communication Equipment Co.), and the results shown in Table 7.

TABLE 7

| Example | Filler Description | Average PIM Result dBc |
|---|---|---|
| G | Synthetic Microsphere 6 | −163.3 |
| C | Synthetic Microsphere 3 | −166.1 |
| H | Synthetic Microsphere 7 | −167.5 |
| I | Synthetic Microsphere 8 | −165.8 |
| E | Natural Microsphere 9 | −155.6 |

In view of the results in Table 7, PIM for the candidate material Synthetic Microsphere 8 filler were quite good, with an average value of −166 dBc, and were similar to a PTFE control. This is a significant differentiating characteristic in favor of the synthetic microspheres.

Ranges disclosed herein are inclusive of the recited endpoint and are independently combinable. "Combination" is inclusive of blends, mixtures, alloys, reaction products, and the like. Also, "combinations comprising at least one of the foregoing" means that the list is inclusive of each element individually, as well as combinations of two or more elements of the list, and combinations of one or more elements of the list with non-list elements. The terms "first," "second," and so forth, herein do not denote any order, quantity, or importance, but rather are used to distinguish one element from another. The terms "a" and "an" herein do not denote a limitation of quantity, but rather denote the presence of at least one of the referenced item. The modifier "about" used in connection with a quantity is inclusive of the state value and has the meaning dictated by context, (e.g., includes the degree of error associated with measurement of the particular quantity). In addition, it is to be understood that the described elements can be combined in any suitable manner in the various embodiments.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While the invention has been described with reference to several embodiments thereof, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A circuit subassembly, comprising
   a conductive layer disposed on a dielectric substrate layer, wherein the composition of the dielectric substrate layer comprises, based on the volume of the dielectric substrate layer:
   about 30 to about 90 volume percent of a polymer matrix material; and
   about 5 to about 70 volume percent of hollow borosilicate microspheres
   wherein the borosilicate microspheres are a product of a process of subjecting the borosilicate microspheres to an alkaline solution; and wherein the dielectric substrate layer has a dielectric constant of less than about 3.5 and a dissipation factor of less than about 0.006 at 10 GHz.

2. The circuit subassembly of claim 1, wherein the circuit subassembly has a dissipation factor of less than about 0.0035 at 10 GHz.

3. The circuit subassembly of claim 1, wherein the circuit subassembly has a passive intermodulation (PIM) that is less than −154 dBc.

4. The circuit subassembly of claim 1, wherein the mean particle size of the microspheres is less than 70 micrometers.

5. The circuit subassembly of claim 1, wherein the microspheres further comprise an inert gas within the hollow microspheres.

6. The circuit subassembly of claim 1, wherein the microspheres have a ferric oxide content of about 0.5 weight percent, as measured by XPS surface analysis, based on the total weight of the composition.

7. The circuit subassembly of claim 1, wherein the microspheres have a density of 0.20 to 0.60 g/cc.

8. The circuit subassembly of claim 1, wherein the microspheres have a sodium oxide content of not more than about 5 weight percent, as measured by XPS surface analysis.

9. The circuit subassembly of claim 1, wherein the microspheres have a sodium oxide content of 2.5 to 4.5 weight percent, as measured by XPS surface analysis.

10. The circuit assembly of claim 1, wherein the borosilicate microspheres are a product made by a process in which treatment with the alkaline solution reduced the sodium oxide content below a preselected amount.

11. The circuit assembly of claim 10, wherein the borosilicate microspheres are a product of a process comprising washing the microspheres in a strong aqueous alkaline solution until the measured sodium oxide content is reduced by at least 25 wt. % of the original amount.

12. The circuit assembly of claim 8, wherein the borosilicate microspheres are a product of a process in which the content of sodium oxide is reduced by at least 2 wt. % as measured by XPS surface analysis.

13. The circuit assembly of claim 1, wherein the borosilicate microspheres are a product of a process that does not comprise washing or leaching the microspheres with an acidic solution to obtain the final sodium oxide content of the microspheres.

14. The circuit subassembly of claim 1, wherein the borosilicate microspheres have a median particle diameter of 20 to 100 micrometers.

15. The circuit subassembly of claim 1, wherein the dielectric substrate layer comprises one or more additional fillers, in an amount from 20 to 80 vol. %, based on the total volume of the filler component.

16. The circuit subassembly of claim 15, wherein additional filler is silica, fused amorphous silica, or a combination thereof.

17. The circuit subassembly of claim 1, wherein the polymer matrix material comprises 1,2-polybutadiene, polyisoprene, polyetherimide, a fluoropolymer, polytetrafluoroethylene, polyphenylene ether, polyimide, polyetheretherketone, polyamidimide, polyethylene terephthalate, polyethylene naphthalate, polycyclohexylene terephthalate, or a combination comprising at least one of the foregoing.

18. The circuit subassembly of claim 1, wherein the polymer matrix material is polytetrafluoroethylene.

19. The circuit subassembly of claim 1, wherein the polymer matrix material comprises 1,2-polybutadiene, polyisoprene, or a combination of 1,2-polybutadiene and polyisoprene.

20. The circuit subassembly of claim 1, wherein the polymer matrix material comprises poly(arylene ether).

21. The circuit subassembly of claim 19, wherein the polybutadiene or polyisoprene polymer is carboxy-functionalized, and comprises butadiene, isoprene, or butadiene and isoprene, and less than 50 weight percent of a co-curable monomer.

22. The circuit subassembly of claim 1, further comprising a second conductive layer disposed on a side of the dielectric substrate layer opposite a first said conductive layer.

23. The circuit subassembly of claim 1, wherein the conductive layer is a copper foil.

24. The circuit subassembly of claim 1, wherein the conductive layer is etched to provide a circuit.

25. The circuit subassembly of claim 1, wherein the conductive layer is in direct contact with the dielectric substrate layer or optional adhesive layer, without an intervening layer, wherein an optional adhesive layer is less than 10 percent of the thickness of the dielectric substrate layer.

26. The circuit subassembly of claim 1, wherein a bond ply is disposed between and in adjacent contact with two patterned conductive layers, wherein each conductive layer is attached to a dielectric layer.

27. A circuit comprising the circuit subassembly of claim 1.

28. A multilayer circuit comprising the circuit subassembly of claim 1.

29. The multilayer circuit of claim 28, wherein the circuit subassembly is used in an antenna.

30. A method of making a circuit subassembly, the method comprising:
- treating hollow borosilicate microspheres with an alkaline solution;
- combining the hollow borosilicate microspheres with a polymer matrix material to form a dielectric composite material;
- forming a layer of the dielectric composite material, thereby obtaining a dielectric substrate layer;
- disposing a conductive layer on the dielectric substrate layer; and
- laminating the dielectric substrate layer and the conductive layer, wherein the dielectric substrate layer exhibits a dielectric constant of less than about 3.5 and a dissipation factor of less than about 0.006 at 10 GHz.

31. The method of claim 30, wherein treating the hollow borosilicate microsphere with an alkaline solution comprises washing the borosilicate microspheres with an aqueous alkaline solution to effectively reduce the sodium oxide content of the borosilicate microspheres to a preselected amount, as determined by XPS surface analysis.

32. The method of claim 31, wherein treating the borosilicate microspheres with an alkaline solution comprises reducing the sodium oxide content by at least 25 wt. % of the original amount, as determined by XPS surface analysis.

33. The method of claim 31, wherein treating the borosilicate microspheres with an alkaline solution comprises reducing the sodium content by at least 1 wt. %, as determined by XPS surface analysis.

34. The method of claim 31, wherein the borosilicate microspheres are not washed with a strong acidic solution to effectively lower and obtain a final sodium oxide content in the borosilicate microspheres, as determined by XPS surface analysis.

* * * * *